United States Patent [19]
Hsu et al.

[11] Patent Number: 6,011,285
[45] Date of Patent: Jan. 4, 2000

[54] C-AXIS ORIENTED THIN FILM FERROELECTRIC TRANSISTOR MEMORY CELL AND METHOD OF MAKING THE SAME

[75] Inventors: Sheng Teng Hsu; Jong Jan Lee, both of Camas; Chien Hsiung Peng, Vancouver, all of Wash.

[73] Assignees: Sharp Laboratories of America, Inc., Camas, Wash.; Sharp Kabushiki Kaisha, Osaka, Japan

[21] Appl. No.: 09/002,364

[22] Filed: Jan. 2, 1998

[51] Int. Cl.[7] .................................................. H01L 29/788
[52] U.S. Cl. ........................ 257/295; 257/310; 257/315; 257/316; 257/410; 257/411; 365/145; 365/177; 365/185.26
[58] Field of Search ..................................... 257/295, 310, 257/410, 411, 315, 316; 365/177, 185.26, 145

[56] References Cited

U.S. PATENT DOCUMENTS

| | | | |
|---|---|---|---|
| 4,262,339 | 4/1981 | Geary ....................................... | 365/145 |
| 5,070,026 | 12/1991 | Greenwald et al. ......................... | 437/3 |
| 5,384,294 | 1/1995 | Teowee et al. ............................ | 501/134 |
| 5,736,759 | 4/1998 | Hanshalter ............................... | 257/295 |

OTHER PUBLICATIONS

Peng et al., "Oriented Lead Germanate Thin Films by Excimer Laser Ablation", *Appl. Phys. Lett.* 60(7), Feb. 17, 1992, pp. 827–829.

Sinharoy et al., "Growth and the Microstructural and Ferroelectric Characterization of Oriented $BaMgF_4$ Thin Films", *IEEE Transactions on Ultrasonics, Ferroelectrics, and Frequency Control*, vol. 38, No. 6, Nov., 1991, pp. 663–667.

Nakao et al., "Study on Ferroelectric Thin Films for Application to NDRO Non–volatile Memories," *Integrated Ferroelectrics*, 1995, vol. 6, pp. 35–46.

Nakamura et al., "Preparation of $Bi_4Ti_3O_{12}$ Films by MOCVD and Their Application to Memory Devices," *Integrated Ferroelectrics*, vol. 6, 1995, pp. 35–46.

*Primary Examiner*—William Mintel
*Attorney, Agent, or Firm*—David C. Ripma

[57] ABSTRACT

The structure of a c-axis FEM cell semiconductor includes a silicon substrate; a source junction region and a drain junction region located in the substrate; a gate junction region located between the source junction region and the drain junction region; a FEM gate unit including a lower electrode, a c-axis oriented $Pb_5Ge_3O_{11}$ FE layer and an upper electrode; wherein the FEM gate unit is sized on the gate junction region such that any edge of said FEM gate unit is a distance "D" from the edges of the source junction region and the drain junction region; an insulating layer, having an upper surface, overlying the junction regions, the FEM gate unit and the substrate; and source, drain and gate electrodes.

17 Claims, 6 Drawing Sheets

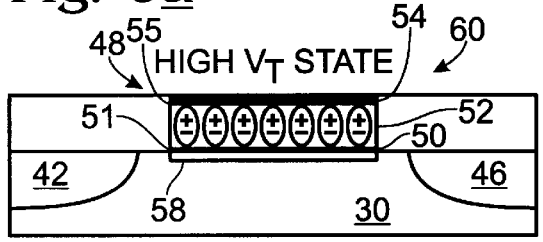
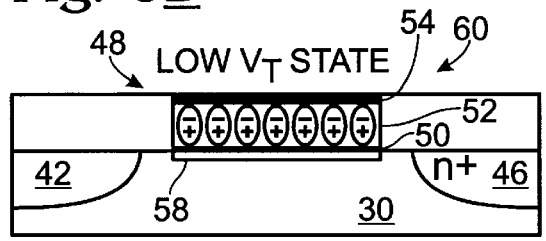
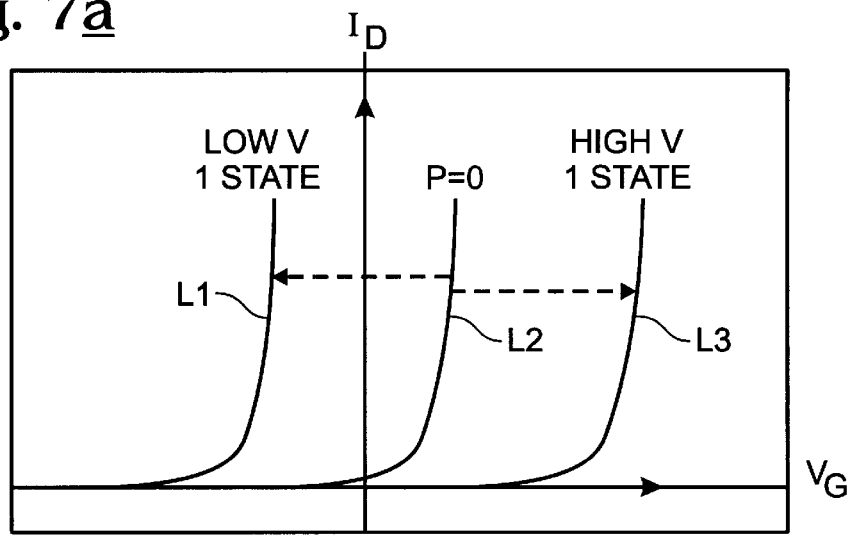
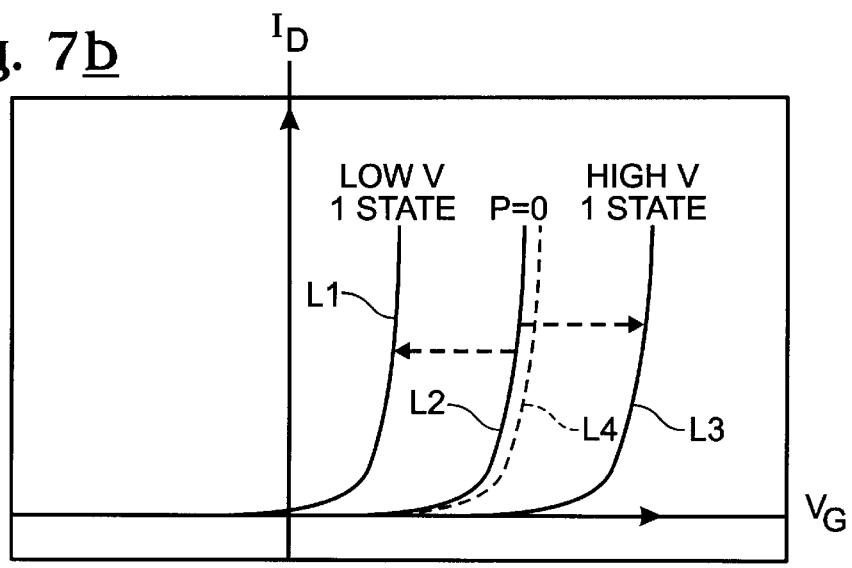

C-AXIS ORIENTED THIN FILM FERROELECTRIC TRANSISTOR MEMORY CELL AND METHOD OF MAKING THE SAME

RELATED APPLICATIONS

The following are applications which are related to the present application: application Ser. Nos. 08/812,759, filed Mar. 7, 1997, of Hsu et al., for ONE TRANSISTOR FERROELECTRIC MEMORY CELL AND METHOD OF MAKING THE SAME; Ser. No. 08/834,499, filed Apr. 4, 1997, for SHALLOW JUNCTION FERROELECTRIC MEMORY CELL HAVING A LATERALLY EXTENDING p-n JUNCTION AND METHOD OF MAKING THE SAME; Ser. No. 08/870,161, filed Jun. 6, 1997, for TWO TRANSISTOR FERROELECTRIC MEMORY CELL AND METHOD OF MAKING THE SAME; Ser. No. 08/869,534, file Jun. 6, 1997, for SHALLOW JUNCTION FERROELECTRIC MEMORY CELL AND METHOD OF MAKING THE SAME; Ser. No. 08/870,375, filed Jun. 6, 1997, for FERROELECTRIC MEMORY CELL FOR VLSI RAM ARRAY AND METHOD OF MAKING THE SAME; and Ser. No. 08/905,380, file Aug. 4, 1997, for SINGLE TRANSISTOR FERROELECTRIC MEMORY CELL WITH ASYMMETRICAL FERROELECTRIC POLARIZATION AND METHOD OF MAKING THE SAME.

BACKGROUND OF THE INVENTION

This application relates to ferroelectric thin films which are used in nonvolatile memories and specifically to a C-axis oriented ferroelectric used in a metal-ferroelectric-metal-silicon-conductor. Known ferroelectric random access memories (FRAM) are constructed with one transistor (1T) and one capacitor (1C). The capacitor is generally made by sandwiching a thin ferroelectric film between two conductive electrodes, which electrodes are usually made of platinum. The circuit configuration and the read/write sequence of this type of memory are similar to that of conventional dynamic random access memories (DRAM), except that no data refreshing is necessary in a FRAM. Known FRAM devices, however, have a fatigue problem that has been observed in the ferroelectric capacitor, which is one of the major obstacles that limit the viable commercial use of such memories. The fatigue is the result of a decrease in the switchable polarization (stored nonvolatile charge) that occurs with an increased number of switching cycles. As used in this case, "switching cycles" refers to the sum of reading and writing pulses in the memory.

Another known use of ferroelectric thin films in memory applications is to form a ferroelectric-gate-controlled field effect transistor (FET) by depositing the ferroelectric thin film directly onto the gate area of the FET. Such ferroelectric-gate controlled devices have been known for some time and include devices known as metal-ferroelectric-silicon (MFS) FETs. FRAMs incorporating the MFS FET structure have two major advantages over the transistor-capacitor configuration: (1) The MFS FET occupies less surface area, and (2) provides a non-destructive readout (NDR). The latter feature enables a MFS FET device to be read thousands of times without switching the ferroelectric polarization. Fatigue, therefore, is not a significant concern when using MFS FET devices. Various forms of MFS FET structures may be constructed, such as metal ferroelectric insulators silicon (MFIS) FET, metal ferroelectric metal silicon (MFMS) FET, and metal ferroelectric metal oxide silicon (MFMOS) FET.

There are a number of problems that must be overcome in order to fabricate an efficient MFS FET device. The first problem is that it is difficult to form an acceptable crystalline ferroelectric thin film directly on silicon. Such structure is shown in U.S. Pat. No. 3,832,700. Additionally, it is very difficult to have a clean interface between the ferroelectric material and the silicon. Further, there is a problem retaining an adequate charge in the ferroelectric material. A ferroelectric memory (FEM) structure on a gate region is shown in U.S. Pat. No. 5,303,182, which emphasizes that the transfer of metal ions into the gate region is undesirable. Similar structure is shown in U.S. Pat. No. 5,416,735.

SUMMARY OF THE INVENTION

The method of forming the c-axis FEM cell semiconductor structure of the invention includes forming a semiconductor structure having a c-axis oriented ferroelectric memory (FEM) gate unit on a substrate of single crystal silicon, and includes forming a silicon device area for the FEM gate unit; implanting doping impurities of a first type in the silicon device area to form a conductive channel of a first type for use as a source junction region and a drain junction region; forming a conductive channel of a second type to act as a gate junction region between the source junction region and drain junction region for the FEM gate unit on the silicon device area; depositing an FEM gate unit over the gate junction region, including depositing a lower electrode, a c-axis oriented $Pb_5Ge_3O_{11}$ FE layer and an upper electrode, wherein the FEM gate unit is sized on the gate junction region such that any edge of the FEM gate unit is a distance "D" from the edges of the source junction region and the drain junction region, where "D" is between about 50 nm and 300 nm; and depositing an insulating structure about the FEM gate unit.

The structure of the c-axis FEM cell semiconductor includes a substrate, which may be a bulk silicon substrate or an SOI-type substrate, includes a single-crystal silicon substrate including an active region therein; a source junction region and a drain junction region located in said active region, doped with doping impurities of a first type to form a pair of conductive channels of a first type; a gate junction region located in said active region between said source junction region and said drain junction region, doped to form a conductive channel of a second type; a FEM gate unit including a lower electrode, a c-axis oriented $Pb_5Ge_3O_{11}$ FE layer and an upper electrode; wherein said FEM gate unit is sized on the gate junction region such that any edge of said FEM gate unit is a distance "D" from the edges of said source junction region and said drain junction region, where "D" is between about 50 nm and 300 nm; an insulating layer, having an upper surface, overlying said junction regions, said FEM gate unit and said substrate; a source electrode and a drain electrode, each located on the upper surface of said insulating layer and extending therethrough to make electrical contact with their respective junction regions, and a gate electrode located on the upper surface of said insulating layer and extending therethrough to make electrical contact with the upper electrode of said FEM gate unit.

An object of the invention is to provide a MFS FET device which incorporates c-axis FE material to overcome the aforementioned problems.

Another object of the invention is to provide an MFS FET device which provides a non-destructive readout.

Yet another object of the invention to provide an MFS FET device that occupies a relatively small surface area.

A further object of the invention is to provide an MFS FET device which requires a relatively low programming voltage.

These and other objects and advantages of the invention will become more fully apparent as the description which follows is read in conjunction with the drawings.

BRIEF DESCRIPTION OF THE DRAWINGS

FIGS. 6a and 6b depict the basic operating principle for the MFS FET of the invention.

FIGS. 7a and 7b are graphs of $I_D$ vs. $V_G$ for the FEM gate unit of the invention.

DETAILED DESCRIPTION OF THE PREFERRED EMBODIMENTS

The c-axis oriented ferroelectric memory (FEM) cell of the invention may be formed on a silicon-on-insulator (SOI or SIMOX) substrate, or, it may be formed in a bulk silicon substrate which has a p⁻ well formed therein. The initial description will concentrate on the formation of the FEM gate unit on a SIMOX substrate. It should be appreciated that in some embodiments of the FEM gate unit, a MOS transistor is fabricated simultaneously with the ferroelectric memory cell by conventional means which are well known to those of ordinary skill in the art. In some instances, for the sake of clarity, some of the drawings do not depict the formation of the MOS transistor.

In the related applications, a number of FE materials were described as being suitable for the construction of FE devices. This disclosure focuses on c-axis oriented $Pb_5Ge_3O_{11}$ thin film FE material, which may be used to fabricate a number of varieties of Metal-Ferroelectric-Semiconductors (MFS), Metal-Ferroelectric-Metal-Semiconductors (MFMS), Metal-Ferroelectric-Insulator-Semiconductors (MFIS), and Metal-Ferroelectric-Metal-Insulator-Semiconductors (MFMIS) structures which may be used as non-volatile FE transistor memories for low voltage VLSI RAM arrays which require relatively low programming voltages. The memory devices about to be described herein have a memory window of $2P_r/C_{FE}$, where $P_r$ is the remnant polarization, and $C_{FE}$ is the ferroelectric capacitance of the FE gate unit. This means that the memory devices need a relatively small dielectric constant in order to operate with a relatively low programming voltage, and also have a reasonably large remnant polarization for a large memory window. We have discovered that c-axis oriented $Pb_5Ge_3O_{11}$ thin film FE having a dielectric constant of about 35, and a remnant polarization of about 3.5 $\mu C/cm^2$ provides the best FE material for these types of memories. In the related applications, the non-c-axis oriented $Pb_5Ge_3O_{11}$ has a remnant polarization of about 0.25 $\mu C/cm^2$. Thus, the remnant polarization of the c-axis oriented FE is about 14X that of the non-c-axis oriented FE. The following descriptions disclose how the c-axis FE material is incorporated into the structures described in the related applications, and how the c-axis material is used when practicing the method of the invention.

Figure 1:
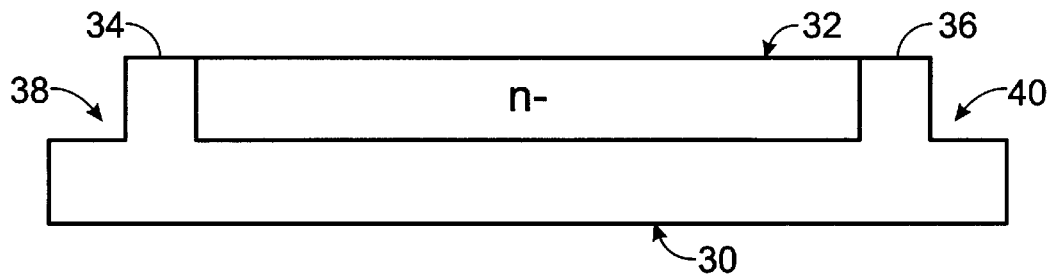
FIGS. 1 and 2 depict exemplars of successive steps in the formation of the substrate used for the FEM cell of the invention.

The construction of a single transistor FEM cell will first be described. Turning now to FIG. 1, a SIMOX substrate is depicted at 30. Substrate 30, in the preferred embodiment, is formed of $SiO_2$, and is a single-crystal substrate. As used herein, "silicon substrate" refers to either a bulk silicon substrate or a SOI substrate, or to any other suitable silicon-based substrate. As depicted in FIG. 1, substrate 30 has been partially etched to the configuration depicted, and a portion of the substrate has been lightly doped to form an active region, or device area, 32, which provides a desired background polarity, in this case, that of an $n^{31}$ region. As is well known to those of a skill in the art, a multiplicity of such regions are formed on the surface of a silicon wafer. For the FEM gate unit of the invention, the cells are arranged in a perpendicular grid to form a memory array.

The initial description is a general method of forming and preparing the substrate that the FEM gate unit will overlay, ultimately resulting in a FEM memory cell. Active region 32 is bordered by non-active, or insulation regions 34, 36.

Figure 2:
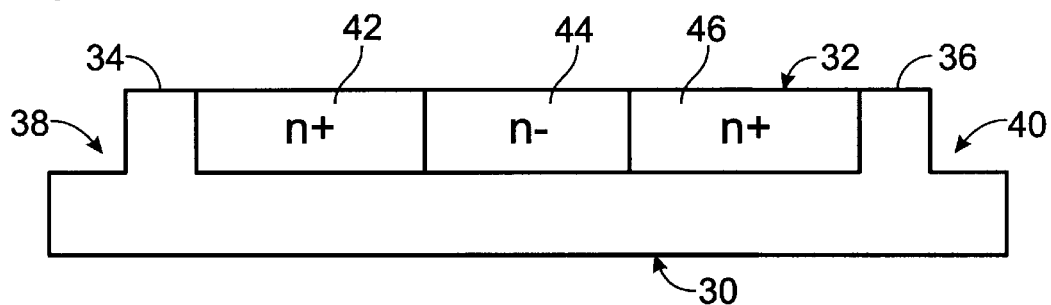

Turning now to FIG. 2, active region 32 may be seen to have been modified to a source region 42, a gate region 44, a drain region 46. These regions are formed by applying a photoresist across active region 32 to mask what will ultimately be gate region 44, and implanting the appropriate ions in the remainder of active region 32 to form two n⁺ layers, also referred to herein as conductive channels of a first type, which will serve as source region 42 and drain region 46. Appropriate ion implantation in this instance may be the implantation of As ions at a preferred energy of about 50 keV, although implantation in a range of 40 keV to 70 keV is acceptable, and a dosing in a range of $2 \cdot 10^{15}$ cm⁻² to $5 \cdot 10^{15}$ cm⁻². Alternately, phosphorus ions may be implanted in an energy range of 30 keV–60 keV in the same dosing range. The wafer is then heat treated to activate and defuse the implanted ions. Temperature range for the heat treatment is in the range of 500° C. to 1100° C. Gate region 44 is also referred to herein as a conductive channel of a second type. In other embodiments described herein, further treatment of the substrate may occur.

Other conductive channel types are sequentially numbered. To summarize the designation of conductive layers, a conductive layer, or channel, of a first type is an n⁺ layer, and functions as a source or drain for the transistor. It is usually formed by treating the silicon substrate or a conductive layer with doping impurities of a first type, which impurities include As and P. A conductive channel of a second type is an n⁻ layer, and generally functions as a gate region. It may be formed by doping a region with doping impurities of a second type, which impurities are specified in connection with the specific embodiments herein. A conductive layer of a third type is a silicide layer, generally formed by diffusion of an impurity of a third type, and results in the formation of a barrier layer. Doping impurities of a fourth type include B and $BF_2$, implanted or diffused to form a p⁻ well, generally used as a gate region, or a precursor for another conductive channel or layer, and referred to as a conductive channel of a fourth type. A conductive channel of a fifth type is a generalized conductive region, further described later herein in connection with specific embodiments. Finally, a conductive channel of a sixth type is a p$^-$n junction, generally formed by diffusion of B or BF$_2$ impurities, which are referred to, in this instance, as doping impurities of a sixth type.

Figure 3:
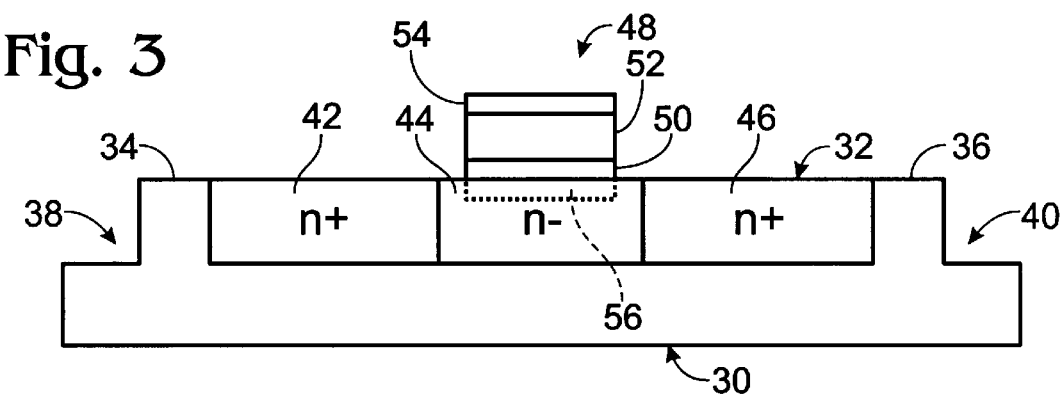
FIG. 3 depicts the FEM gate unit constructed on the substrate.

At this point, formation of the FEM gate unit may begin. Referring now to FIG. 3, a FEM gate unit is identified generally at 48 and includes a lower electrode 50, the c-axis oriented ferroelectric (FE) material 52 and an upper electrode 54. The construction of FEM gate unit 48 begins with the deposition of the lower electrode on gate region 44. Lower electrode 50 may be formed of Pt or Ir, IrO$_2$, an alloy of Pt/Ir, or other suitable conductive material. The thickness of this metal layer is 20 nm to 100 nm.

Next, the Pb$_5$Ge$_3$O$_{11}$ FE material is deposited by chemical vapor deposition (CVD) to a thickness of 50 nm to 400 nm.

The upper electrode 54 is then formed over the FE material. The upper electrode may be formed of the same materials as the lower electrode, to a thickness of 20 nm to 200 nm. A conductive channel precursor is identified at 56. This precursor will ultimately become a metal silicide layer 58 by diffusion of metal ion from lower electrode 50 into the gate region 44. A lower electrode interface 51 is located between FE layer 52 and lower electrode 50. An upper electrode interface is located between FE layer 52 and upper electrode 54.

Photoresist is applied over the FEM gate unit, and the cell is then etched to the proper configuration and size. It should be appreciated that the three layers of the FEM gate unit need not be precisely aligned as shown, as their shape may be formed by applying a photoresist, and etching, with masks that have different geometries. However, for the sake of clarity, the FEM gate unit is depicted as a structure which has contiguous, aligned sidewalls.

Figure 4:
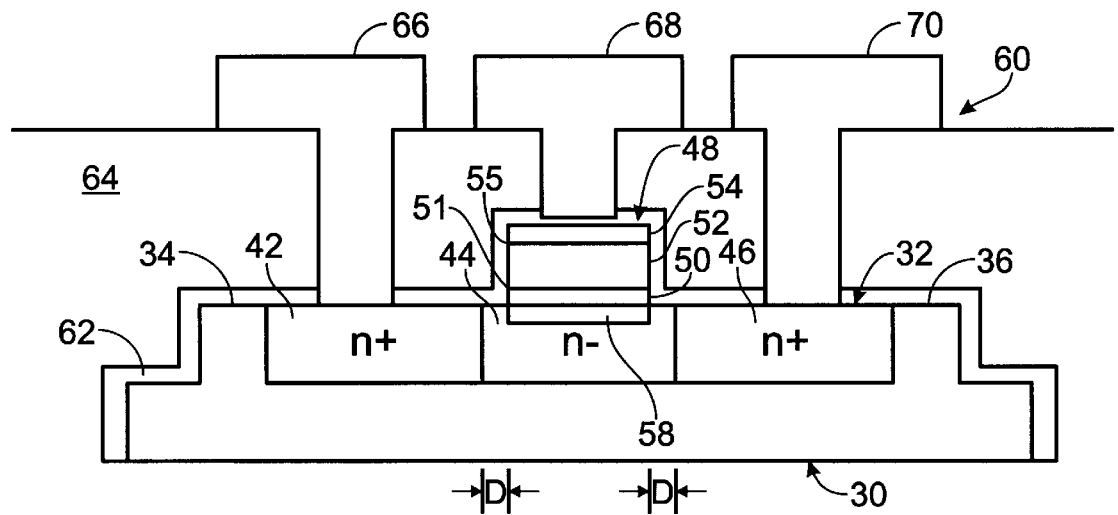
FIG. 4 depicts the first embodiment of the invention having a silicide layer formed under the FEM gate unit in a single transistor FEM cell.

Turning now to FIG. 4, FEM gate unit 48 is depicted as part of a FEM memory cell 60, which includes FEM gate unit 48 and the underlying source, channel and drain regions, which embodiment includes a thin layer of silicide 58 formed under FEM gate unit 48, where conductive channel precursor 56 was located. Silicide layer 58 may be formed prior to the deposition of the components of FEM gate unit 48, as described in connection with a another embodiment of the method of the invention, or, assuming that lower electrode 50 s formed of platinum (Pt), or an alloy thereof, the platinum may be allowed to diffuse into the upper portion of gate region 44, forming a shallow silicide layer which acts as a Schottky barrier, which is referred to herein as a conductive channel of a third type, a shallow junction, or a barrier structure.

A layer of TiO$_x$, 62, or other suitable barrier insulation material is formed by CVD to protect the FEM gate unit. The TiO$_x$ is etched to form the sidewall insulator for the gate electrode. Photoresist is applied and appropriate n$^+$ and p$^+$ regions are formed by ion implantation. An oxide layer 64, generally formed is SiO$_2$, is formed by CVD, or, other suitable passivation insulation is applied. The structure is heat treated, at between 500° C. and 1100° C., to allow passivation and diffusion of the implanted ions. To complete the description of FEM cell 60, bores are formed in oxide layer 64 and a source electrode 66, a gate electrode 68 and a drain electrode 70 are formed and connected to their respective components.

The embodiment depicted in FIG. 4 represents the simplest case of the structure of the invention. The structure is a ferroelectric gate depletion-type MIS transistor. At zero gate voltage, the charge in the n$^-$-channel underlying the FEM gate unit is completely depleted. Accordingly, the leakage current is very small. In order to maintain the small leakage, the distance between the point at which any edge of lower electrode 50 contacts the n silicon and the edges of the n$^-$ source or n$^+$ drain regions, represented by "D", has to be at least 50 nm in order that the leakage current remain small. However, as D increases, the series resistance of the memory cell also increases. It is therefore preferred that D be no larger than 300 nm. The gate leakage current is determined by the platinum to n$^-$ type silicon Schottky barrier and the platinum to c-axis oriented ferroelectric material contact. The gate leakage current is the gate current at a very small up to moderate field intensity. The potential barrier between the platinum and n$^-$ type silicon is 0.9 eV. A potential barrier of this magnitude causes the n$^-$ type silicon channel to be completely depleted when the c-axis oriented ferroelectric material is not polarized, or when the c-axis oriented ferroelectric material is polarized with negative charge at the lower electrode. When the c-axis oriented ferroelectric material is polarized with a positive charge at the lower electrode, the threshold voltage of the memory transistor is small. The nature of these memory charges and techniques for changing the amount of voltage necessary to the program the cells will be described later herein.

Regardless of the method used to form Schottky barrier 58 or a shallow junction layer, the barrier structure serves to provide an efficient switching mechanism for the FEM cell of the invention.

Alternately, the source/drain ion implantation and annealing may be completed before the deposition of the lower gate electrode, if the ferroelectric material is unable to sustain high temperature heat treatment.

Operation

Figure 5:
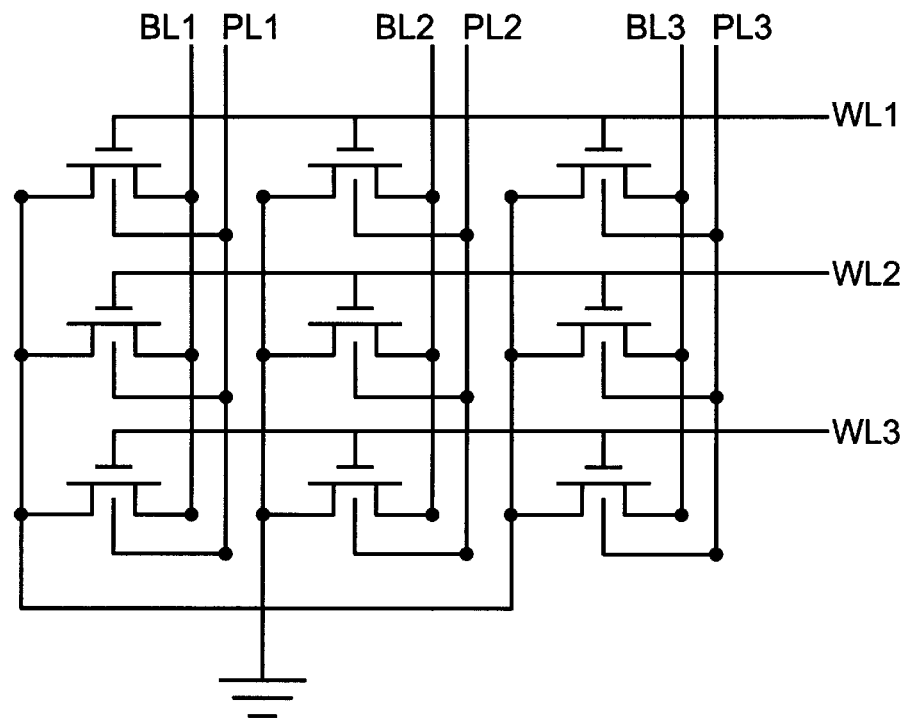
FIG. 5 depicts the perpendicular arrangement of FEM cells on a substrate.

This c-axis oriented ferroelectric memory device may be used in low voltage, high density and high speed applications. The memory cell is laid out on the substrate, as depicted in FIG. 5. FIG. 5 depicts a nine-cell memory array, wherein the word lines are designated WL1, WL2 and WL3, the bit, or drain, lines are designated BL1, BL2 and BL3. The source regions and the substrate of all of the transistors are grounded. The source, word line, and bit line are connected independently to peripheral circuits, as shown in FIG. 5. The memory array is block programmed to the "1" (high conductive) state by applying a positive voltage of $V_{pp}$ to the word line (gate) with the bit line connected to ground. In order to program each individual memory cell to a "0" (low conductive) state, a negative programming voltage, $-V_{pp}$, is applied to the word line while a positive programming voltage of $V_{pp}$ is applied to the bit line. This results in only one cell having a bias voltage of $-V_{pp}$ at the gate and $+V_{pp}$ at the drain. This memory cell is the only cell in the entire array which will be written to the "0" state.

The structure constructed according to the invention is particularly efficient because the FEM gate unit, located over the conductive channel on the gate region, is able to shift the polarity of the gate region, allowing efficient current flow from the source through the gate to the drain. The structure provides for nearly total charge depletion when in an "off" condition, and efficient, transmission of current when in an "on" condition. This is because known FEM cell configurations do not completely allow current flow through the gate region. Such structures may be thought of a switch that is partially "open."

Memory cells constructed according to the invention may be placed in an array of memory cells such that the gate lines run perpendicular to the drain lines, as shown in FIG. 5. In order to write to FEM gate unit 48, $+V_{p1}$ is applied to all gate electrodes, while the source and drain electrodes of the memory cell are at the ground potential. This polarizes the c-axis oriented FE 52 such that a positive charge is located at lower electrode 50 and a negative charge is located at upper electrode 54. (See FIG. 6a). This places FEM gate unit 48 in a high conductive state.

When a negative voltage, $-V_{P0}$, is applied to the gate electrode (program line), and a positive voltage, $+V_{P0}$ is applied to the drain, and the source is grounded, and where $|V_{P1}|>|V_{P0}|$, the FE is polarized with a negative charge at lower electrode 50. This places FEM gate unit 48 in a low conductive state. (see FIG. 6b). The write process enables each memory transistor in a memory array to be written to independent of other memory cells in the array, with no interference to or from the threshold voltages of the other memory cells in the array.

The threshold voltage for FEM gate unit 48 may be determined as follows: for a large scale array the threshold voltage at the "1" state has to be a positive value, i.e., 0.4V to 0.8V. The threshold voltage for the "0" state has to be larger than the supply voltage, i.e., 3.3 V. The $n^-$ channel layer is depleted by the $p^-$ type substrate junction as well as by the lower electrode Schottky barrier, or the very shallow $p^-$ surface layer and the gate bias voltage. It can be shown that the memory window is equal to:

$$\Delta V_T = \frac{2Q_{FE}}{C_{FE}} \quad (1)$$

where $Q_{FE}$ is the remanent charge and $C_{FE}$ is the c-axis oriented ferroelectric capacitance of the gate unit.

During a read operation, a voltage, $V_a$, of no larger than the coercive voltage, i.e., that voltage where the memory content may change, is applied to the gate electrode and the drain electrode. Because the content of the memory cell is not disturbed when any electrode is biased with $V_a$, the read operation will not disturb the memory contents of any memory cell. Therefor, a long charge retention is obtained.

The general $I_D$ vs. $V_G$ plot for the MFMOS FET is depicted in FIG. 7. FIG. 7a depicts the $I_D$ vs. $V_G$ characteristics of a FEM cell with high channel doping, $N_D$. The centerline (L2) is the $I_D$ vs. $V_0$ curve when the FEM gate unit is not charged. When the FEM cell is programmed to a "1" state (L1), the threshold voltage of the FEM cell is negative. Thus, a large drain current may flow through the channel region even if $V_G=0$ V. Such a device is not suitable for large scale array applications.

FIG. 7b depicts the $I_D$ vs. $V_G$ characteristics of a FEM cell with low channel doping $N_D$. The threshold voltage of the FEM cell when it is programmed to a "1" state is positive (L1). No current may flow through the device when the gate is at ground potential. A large scale memory array of such devices will have a very small standby leakage current, and will not require frequent refreshing. The threshold voltage (L3) at a "0" state is always positive.

It can be shown that the lower c-axis oriented ferroelectric capacitance results in higher memory window and lower programming voltage. Thicker film and lower $\epsilon_r$ material can result in lower c-axis oriented ferroelectric capacitance; however, the former choice could increase the programming voltage if the switching field for c-axis oriented ferroelectric is well defined. Common oxide ferroelectric materials exhibit higher $\epsilon_r$ and $T_c$, while non-oxide ferroelectrics exhibit lower $\epsilon_r$ and $T_c$. Oxide $Pb_5Ge_3O_{11}$ thin film has very low $\epsilon_r$ and moderate $T_c$ (178° C.).

Figure 8:
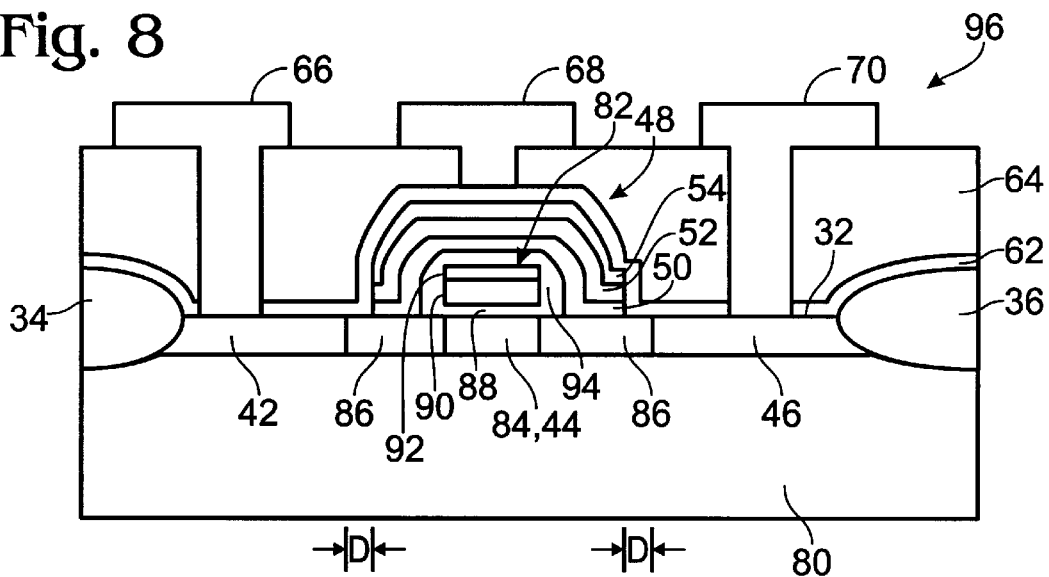
FIG. 8 depicts a two-transistor FEM cell formed on a bulk silicon substrate.

Turning now to FIG. 8, the construction of a two transistor FEM cells will be described. A silicon substrate is depicted at 80. Substrate 80, in this embodiment is a single-crystal substrate, and is formed of bulk silicon. As depicted in FIG. 8, substrate 80 has been modified to the configuration depicted, and a portion of the substrate has been lightly doped to form an active region, or device area, 32, which provides a desired background polarity, in this case, that of an $p^-$ region, referred to herein as a conductive channel of a fourth type. Active region 32 is bounded by insulating regions 34, 36, formed of $SiO_2$ by thermal oxidation or deposited by chemical vapor deposition (CVD), to form LOCOS or mesa isolation between devices. As is well known to those of a skill in the art, a multiplicity of such active regions are formed on the surface of a silicon wafer. For the two transistor memory cell of the invention, the active regions are arranged in a perpendicular grid to form a memory array, as depicted in FIG. 5.

This $p^-$ well, 84, may be formed by implanting B or $BF_2$ ions, referred to herein as doping impurities of a fourth type, on active layer 32. Boron ions may be implanted at an energy of 3 keV to 80 keV, while $BF_2$ ions are implanted with an energy level of between 15 keV and 50 keV. Ion concentration in both instances is in the range of $5 \cdot 10^{11}$ cm$^{-2}$ to $1 \cdot 10^{13}$ cm$^{-2}$. The ions are thermally activated by annealing. The implanted ions will diffuse into the substrate to form a $p^-$ well, referred to herein as a conductive channel fourth type. Diffusion takes place at a temperature in a range of between 800° C. and 1100° C. Channel regions 86, referred to herein as conductive channel of the fifth type, remains on either side of $p^-$ well 84. As used herein, "adjacent" means that the two transistors are formed either along side one another, or that one transistor overlays the other.

A layer of $SiO_2$, 88, is thermally grown over $p^-$ well 84. A layer of $n^+$ polysilicon 90 is deposited thereover by CVD. A layer of silicide 92, may be formed over the $n^+$ polysilicon by CVD, and functions as a part of the MOS transistor, which, although depicted in the drawing, is an optional portion of the method and structure of the invention. Another layer of $SiO_2$, 94, also referred to herein as a transistor insulating layer, is laid down by CVD.

A photomask is used to protect the gate area of MOS transistor 82. $SiO_2$ layer 88, $n^+$ polysilicon layer 90, silicide layer 92 and $SiO_2$ layer 94 are subsequently etched to form a gate for MOS transistor 82. The photoresist material is stripped away. Phosphorous ions, also referred to herein as doping impurities of a second type, are implanted to form the conductive channel of the second type at an energy of between 30 keV to 120 keV, with a dose of $1.0 \cdot 10^{12}$ cm$^{-2}$ to $5.0 \cdot 10^{13}$ cm$^{-2}$ to the $p^-$ well where the FEM gate units are to be constructed, i.e., over gate region 94. Multiple implantation steps, and/or thermal diffusion may be required to obtain an optimum donor distribution in the $n^-$ layer. An additional layer of $SiO_2$ is deposited and etched without any masking to form the sidewall oxide, which layer is included in the drawing as part of $SiO_2$ layer 94.

FEM gate unit 48 is fabricated over and adjacent to MOS transistor 82. Gate unit 48 includes a lower electrode 50, a FE layer 52, and an upper electrode 54. The construction of FEM gate unit 48 begins with the deposition of the lower electrode on $SiO_2$ layer 94, which extends partially over channel regions 86. Lower electrode 50 may be formed as previously described. The thickness of electrode 50 is 20 nm to 100 nm, in the preferred embodiment.

Next, c-axis oriented FE material 52 is deposited by CVD. FE material 52 is deposited to a thickness of 50 nm to 400 nm. Upper electrode 54 is then formed over the FE material. The upper electrode may be formed of the same materials as the lower electrode, to a thickness of 20 nm to 200 nm.

Photoresist is applied over the FEM gate unit, and the cell is then etched to the proper configuration and size. It should be appreciated that the three layers of the FEM gate unit need not be precisely aligned as shown, as their shape may be formed by applying a photoresist, and etching, with masks that have different geometries. However, for the sake of clarity, the FEM gate unit is depicted as a structure which has contiguous, aligned sidewalls. The photo-resist is stripped from the FEM gate unit and a layer of $TiO_x$ 62, $Si_3N_4$, or other suitable dielectric material is deposited by CVD to isolate the ferroelectric material from the silicon oxide.

Device area 32 is then treated by arsenic ion implantation to form an $n^+$ silicon source region 42 and an $n^+$ silicon drain region 46, referred to herein as conductive channels of a first type. Appropriate ion implantation in this instance may be the implantation of As ions at a preferred energy of about 50 keV, although implantation in a range of 40 keV to 70 keV is acceptable, and a dosing in a range of $1 \cdot 10^{15}$ cm$^{-2}$ to $5 \cdot 10^{15}$ cm$^{-2}$. Alternately, phosphorus ions may be implanted in an energy range of 30 keV–60 keV in the same dosing range. In either case, the material implanted at this step of the construction is referred to herein as a doping impurity of a first type.

The structure is completed with the deposition of a silicon oxide layer 64, a covering insulating layer, over the extend of the structure, and the milling and insertion of a source electrode 66, a gate electrode 68, and a drain electrode 70. A two transistor FEM cell is depicted generally at 96, Referring now to FIG. 9, the structure of the invention is depicted generally at 98 as would be formed on an SOI substrate, which includes substantially all of the same components, referred to by like reference numbers, except that the substrate is formed of silicon oxide 30 rather than the bulk silicon used in the embodiment in FIG. 8.

Figure 9:
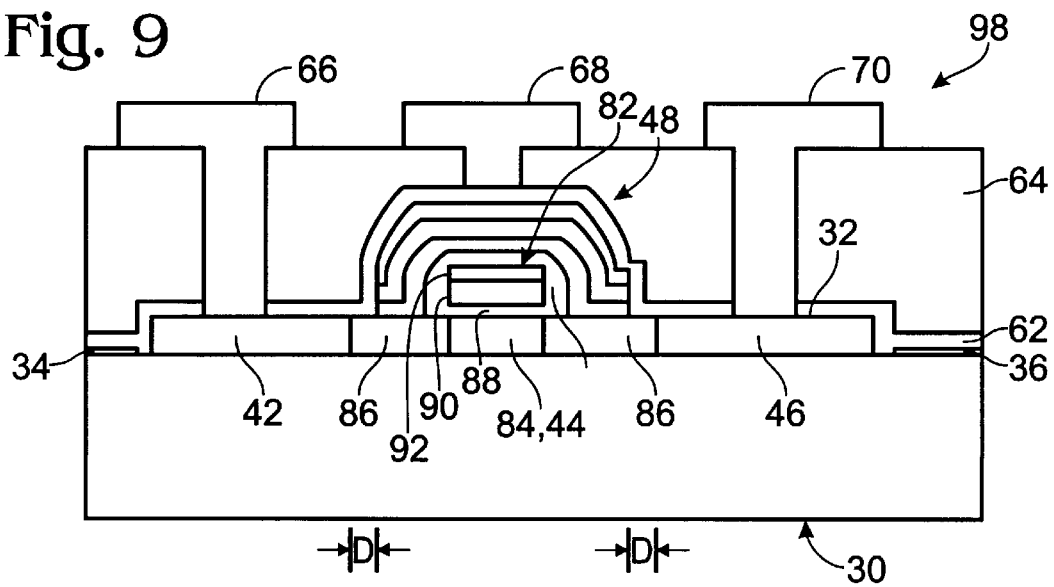
FIG. 9 depicts a two-transistor FEM cell formed on a SOI substrate.

The embodiments depicted in FIGS. 8 and 9 represent a c-axis oriented ferroelectric gate depletion-type MIS transistor in combination with a conventional MOS transistor. As shown in FIG. 6a, the threshold voltage of the MFS transistor may be negative when the FE is polarized with a positive charge at the lower electrode interface 51. When the FE is polarized with a negative charge at the lower electrode interface 51, the threshold voltage of the MFS transistor is very large (FIG. 6b). At zero gate voltage, the MOS transistor is not conductive. Therefore, there is no current flow through the device even if the threshold voltage of the MFS transistor is negative.

When the gate voltage is equal to the operation voltage, the MOS transistor is very conductive. The device current is controlled by the current flow in the MFS transistor. When the MFS transistor is at "0" state, i.e., the threshold voltage is larger than the operation voltage, there is no current flow through the device. In order to maintain a small leakage current at the "0" state, the distance between any edge of lower electrode 50, and any edge of the $n^+$ source and $n^+$ drain regions, represented by "D", has to be at least 50 nm. However, as previously noted, as D increases, the series resistance of the memory cell also increases. It is therefore preferred that D be no larger than 300 nm. When the MFS transistor is at the "1" state, i.e., the threshold voltage is very low, or has a negative value, both the MOS transistor and the MFS transistor are conductive. Therefore, a large current can flow through the device. This enables the device to be used in large scale memory arrays even if the "1" state threshold voltage of the MFS transistor is a negative value.

The threshold voltage for FEM gate unit 48, shown in FIGS. 8 and 9, may be determined as follows: for a large scale array the threshold voltage at the "1" state may be negative or a small positive voltage. The threshold voltage for the "0" state has to be larger than the supply voltage, i.e., 3.3 V.

The width of the space in the $n^-$ region of a Pt-n silicon barrier is about 0.3 μm if the doping density of the $n^-$ region is about $1.0 \cdot 10^{16}$ cm$^{-3}$. The threshold voltage may be adjusted by changing the doping density and the thickness of the $n^-$ channel layer and the permitivity and the remnant charge of the c-axis oriented ferroelectric capacitor.

During a read operation, a voltage, $V_a$, of no larger than the coercive voltage, i.e., that voltage where the memory content may change, is applied to the gate electrode and the drain electrode. Because the content of the memory cell is not disturbed when any electrode is biased with $V_a$, the read operation will not disturb the memory contents of any memory cell. Therefore, a long charge retention is obtained.

The general $I_D$ vs. $V_G$ plot for the MFMOS FET is depicted in FIG. 7. FIG. 7a depicts the $I_D$ vs. $V_G$ characteristics of a FEM cell with high channel doping, $N_D$. The centerline (L2) is the $I_D$ vs. $V_O$ curve when the FEM gate unit is not charged. When the FEM cell is programmed to a "1" state (L1), the threshold voltage of the FEM cell is negative. When the FEM cell is programmed to a "0" state (L3), the threshold voltage of the FEM cell is positive. Thus, at the "1" state, a large drain current may flow through the channel region even if $V_G=0V$. Such a device alone is not suitable for large scale array applications.

FIG. 7b depicts the $I_D$ vs. $V_G$ characteristics of the device of this invention. L2 depicts the $I_D$ vs. $V_G$ curve when the FEM gate unit is not charged. When the FEM cell is programmed to a "1" state (L1), the threshold voltage of the FEM cell is negative. When the FEM cell is programmed to a "0" state (L3), the threshold voltage of the FEM cell is positive. The threshold voltage, dashed line L4, of the MOS transistor limited the threshold voltage of the device to a small positive value when it is programmed to a "1" state. No current may flow through the device when the gate is at ground potential. A large scale memory array of such devices will have a very small standby leakage current, and will not require frequent refreshing.

Figure 10:
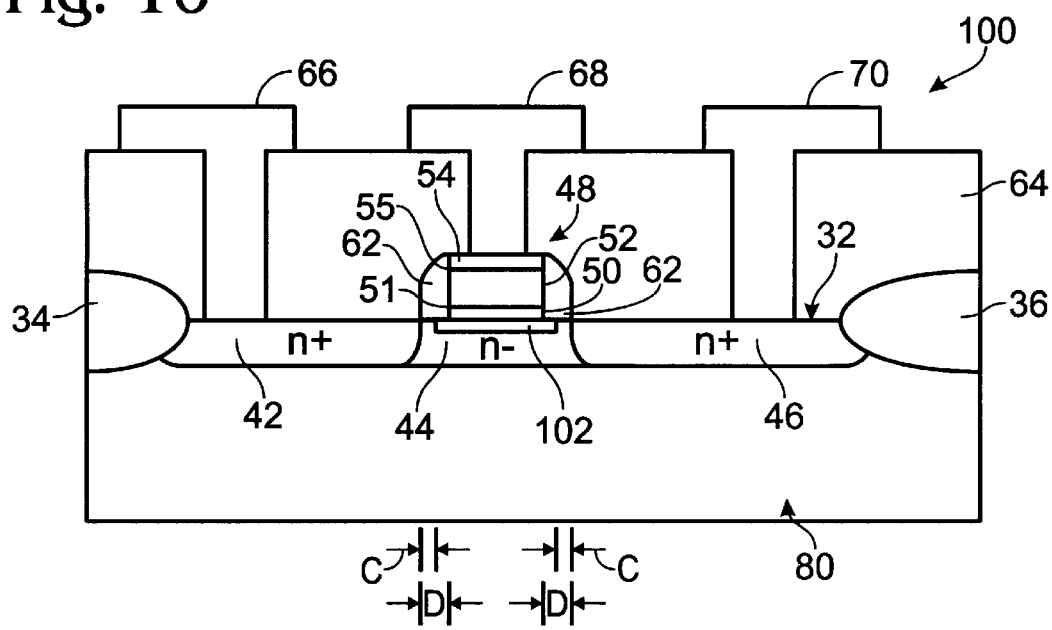
FIG. 10 depicts a FEM cell having a shallow junction layer formed therein.

Turning now to FIG. 10, construction of a FEM cell having a shallow junction layer will be described. A silicon substrate is depicted at 80. Substrate 80, in the preferred embodiment is a single-crystal substrate, and is formed of bulk silicon. Other embodiments may be formed on a SOI substrate. Using a bulk CMOS substrate as an example to explain the fabrication process, the initial step is to fabricate $n^-$ well and $p^-$ well structures, isolate these structures, and implant appropriate ions to provide threshold voltage adjustment for the transistors. As depicted in FIG. 10, substrate 80 is etched and a portion of the substrate is lightly doped to form an active region, or device area, 32, which provides a desired background polarity, in this case, that of an $n^-$ region, referred to herein as a conductive channel of a second type. Active region 32 is bounded by insulating regions 34, 36, formed of $SiO_2$. As is well known to those of a skill in the art, a multiplicity of such regions are formed on the surface of a silicon wafer. For the FEM gate unit of the invention, the cells are arranged in a perpendicular grid to form a memory array, as shown in FIG. 5.

Photoresist is used to mask sections of the wafer. Next, phosphorous ions, also referred to herein as doping impurities of a second type, are implanted at an energy of between 30 keV to 120 keV, with a dose of $1.0 \times 10^{12}$ cm$^{-2}$ to $5.0 \times 10^{13}$ cm$^{-2}$ to the p$^-$ well where the FEM gate unit is to be constructed. Multiple implantation steps, and/or thermal diffusion may be required to obtain an optimum donor distribution in the n$^-$ layer. The photoresist is stripped away. The implanted n$^-$ type silicon layer may also be replaced with a selective epitaxial growth of silicon with a thickness of 100 nm to 1000 nm.

A FEM gate unit is identified generally at 48 and includes lower electrode 50, c-axis oriented ferroelectric (FE) material 52, and upper electrode, 54. The construction of FEM gate unit 48 begins with the deposition of lower electrode 50 on active region 32. Lower electrode 50 may be formed as previously described. The thickness of this metal is 20 nm to 100 nm, in the preferred embodiment.

Ultimately, a p$^-$ layer 102 will be formed between FEM gate unit 48 and a gate junction region 44. The p$^-$ layer may be formed by implanting B or BF$_2$ ions, referred to herein as doping impurities of the sixth type, into the surface of the conducting channel of the second type, or into lower electrode 50. Boron ions may be implanted at an energy of 3 keV to 80 keV, while BF$_2$ ions are implanted with an energy level of between 15 keV and 50 keV. Ion concentration in both instances are in the range of $1 \cdot 10^{11}$ cm$^{-2}$ to $1 \cdot 10^{-2}$. During an annealing step, described later herein, the implanted ions will diffuse into an n$^-$ gate junction region, to form a p$^-$ layer, referred to herein as a conductive channel of a sixth type.

Next, the c-axis oriented, Pb$_5$Ge$_3$O$_{11}$, FE material is deposited by chemical vapor deposition (CVD). The FE material 20 is deposited to a thickness of 50 nm to 400 nm.

Upper electrode 54 is then formed over the FE material. The upper electrode may be formed of the same materials as the lower electrode, to a thickness of 20 nm to 200 nm.

Photoresist is applied over the FEM gate unit, and the cell is then etched to the proper configuration and size. It should be appreciated that the three layers of the FEM gate unit need not be precisely aligned as shown, as their shape may be formed by applying a photoresist, and etching, with masks that have different geometries. However, for the sake of clarity, the FEM gate unit is depicted as a structure which has contiguous, aligned sidewalls.

A layer of TiO$_x$, Si$_3$N$_4$, or other suitable barrier insulation material 62, is formed by CVD to protect the FEM gate unit. The barrier insulation material is etched to form the sidewall insulator for the gate electrode.

Active region 32 may be seen to have been modified to a source region 42 and a drain region 46. These regions are formed by implanting the appropriate ions, also referred to herein as doping impurities of a first type, in the remainder of active region 32 to form two n$^+$ layers, also referred to herein as conductive channels of a first type, which will serve as source region 42 and drain region 46. Appropriate ion implantation in this instance may be the implantation of As ions at a preferred energy of about 50 keV, although implantation in a range of 40 keV to 70 keV is acceptable, and a dosing in a range of $1 \cdot 10^{15}$ cm$^{-2}$ to $5 \cdot 10^{15}$ cm$^{-2}$. Alternately, phosphorus ions may be implanted in an energy range of 30 keV–60 keV in the same dosing range. A gate region is depicted at 44.

Next, the wafer is heat treated to activate and diffuse the implanted ions, both in the source region and drain region, and in the lower electrode. Diffusion of the ions implanted in lower electrode 50 results in the formation of a shallow junction 102 under FEM gate unit 48, which is referred to herein as a conductive channel of a sixth type. Temperature range for the heat treatment is in the range of 500° C. to 1100° C., to allow passivation and diffusion of the implanted ions. A layer 64 of SiO$_2$ is then formed over the structure by CVD, or, other suitable passivation insulation is applied. FEM gate unit 48 is depicted as part of a FEM memory cell 100, which includes FEM gate unit 48 and the underlying source, channel and drain regions, which embodiment includes a thin shallow junction region 102, which is a p$^-$ layer, formed under FEM gate unit 48.

To complete the description of FEM cell 100, bores are formed in oxide layer 64 to receive a source electrode 66, a gate electrode 68 and a drain electrode 70, which are connected to their respective components.

The embodiment depicted in FIG. 10 represents a c-axis oriented ferroelectric gate depletion-type MIS transistor. At zero gate voltage, the charge in the n$^-$ channel underlying the FEM gate unit is completely depleted. Accordingly, the leakage current is very small. In order to maintain the small leakage, the distance between any edge of lower electrode 50 and the edges of the n$^+$ source or n$^+$ drain regions, represented by "D", has to be at least 50 nm in order that the leakage current remain small. However, as D increases, the series resistance of the memory cell also increases. It is therefore preferred that D be no larger than 300 nm. The gate leakage current is determined by the p$^-$ type silicon shallow junction 102 and the platinum or iridium to c-axis oriented ferroelectric material contact. The leakage current is the gate current at a very small up to moderate field intensity. The potential barrier between the platinum and n$^-$ type silicon is 0.9 eV. The potential barrier between the p$^-$ conductive layer of the fourth type 102 and the n$^-$ conductive layer of the second type 44 is also on the order of 0.9 eV. A potential barrier of this magnitude causes the n$^-$ type silicon channel to be completely depleted when the c-axis oriented ferroelectric material is not polarized. When the c-axis oriented ferroelectric material is polarized with positive charge at the lower electrode interface 51, the threshold voltage is small. When the c-axis oriented ferroelectric material is polarized with a negative charge at the lower electrode interface 51, the threshold voltage of the memory transistor is very large. The nature of these memory charges and techniques for changing the amount of voltage necessary to the program the cells will be described later herein.

Diffusion of implanted B or BF$_2$ ions into the gate junction region is controlled to maintain a distance "C" between any edge of shallow junction layer 102 and the source and drain regions. In the preferred embodiment, "C" is between about 0 nm and 300 nm. The shallow junction structure serves to provide a reliable potential barrier between gate region 44 and the conducting channels for low leakage current and provides an efficient switching mechanism for the FEM cell of the invention.

Alternately, the source/drain ion implantation and annealing may be completed before the deposition of the lower gate electrode, if the c-axis oriented ferroelectric material is unable to sustain high temperature heat treatment.

The structure constructed according to the invention is particularly efficient because the FEM gate unit, located over the conductive channel on the gate region, is able to shift the polarity of the gate region, allowing efficient current flow from the source through the channel to the drain. The structure provides a total charge depletion when in an "off" condition. The operating theory of a depletion-type device is similar to that of a junction FET.

Memory cells constructed according to the invention may be placed in an array of memory cells such that the gate lines run perpendicular to the drain lines, as shown in FIG. 5.

When a negative voltage, $-V_{P0}$, is applied to gate electrode 68 (program line), and a positive voltage, $+V_{P0}$ is applied to the drain electrode 70, and the source electrode 66 is grounded, and where $|V_{P1}|>|V_{P0}|$, the FE is polarized with a negative charge at lower electrode interface 51. This places FEM gate unit 48 in a low conductive state. (see FIG. 6a). The write process enables each memory transistor in a memory array to be written to independent of other memory cells in the array, with no interference to the other memory cells in the array.

In order to write to FEM gate unit 48, $+V_{P1}$ is applied to all gate electrodes 68, while the source electrodes 66 and drain electrodes 70 of the memory cell are at the ground potential. This polarizes FE 52 such that a positive charge is located at lower electrode interface 51 and a positive charge is located at upper electrode interface 55. (See FIG. 6b). This places FEM gate unit 48 in a high conductive state.

The threshold voltage for FEM gate unit 48 may be determined as follows: for a large scale array the threshold voltage at the "1" state has to be a small positive value, i.e., 0.4V to 0.8V. The threshold voltage for the "0" state has to be larger than the supply voltage, i.e., 3.3 V. The $n^-$ channel layer is depleted by the $p^-$ type substrate junction as well as by the very shallow $p^-$ surface layer and the gate bias voltage. The memory window is defined by Equation (1).

During a read operation, a voltage, $V_a$, of no larger than the coercive voltage, i.e., that voltage where the memory content may change, is applied to the gate electrode and the drain electrode. Because the content of the memory cell is not disturbed when any electrode is biased with $V_a$, the read operation will not disturb the memory contents of any memory cell. Therefore, a long charge retention is obtained.

Figure 11:
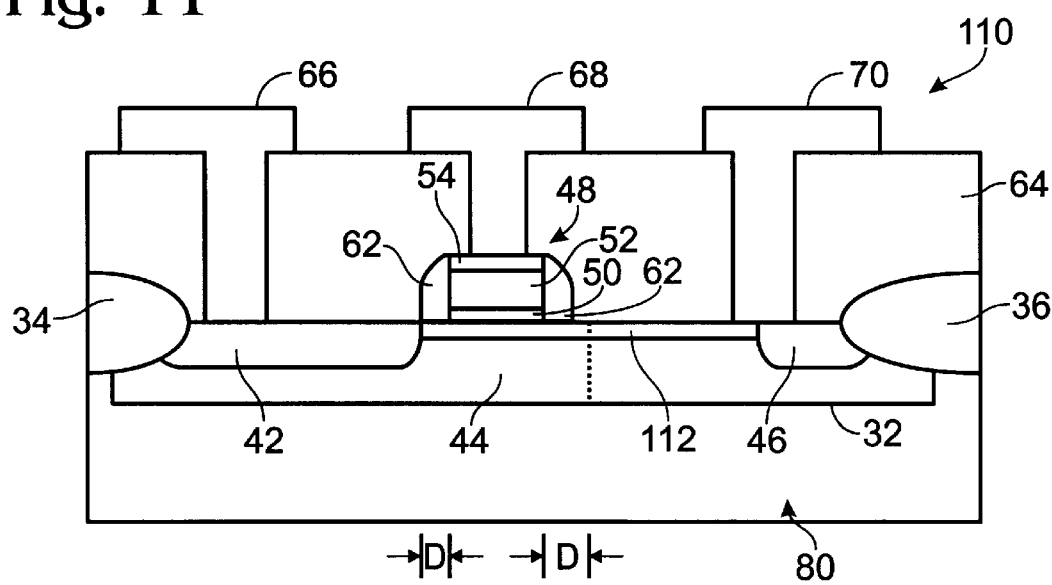
FIG. 11 depicts a FEM cell having a shallow junction layer and a laterally extending p⁻n layer formed therein.

Turning now to FIG. 11, a FEM cell having a shallow junction layer and a laterally extending $p^-$ junction is depicted generally at 110. A silicon substrate is depicted at 80. Substrate 80, in this embodiment is a single-crystal substrate, and is formed of bulk silicon. Substrate 80 is etched to the configuration depicted, and a portion of the substrate is lightly doped to form an active region, or device area, 32, which provides a desired background polarity, in this case, that of an $n^-$ region, referred to herein as a conductive channel of a second type. Active region 32 is bounded by insulating regions 34, 36, formed of $SiO_2$. As is well known to those of a skill in the art, a multiplicity of such regions are formed on the surface of a silicon wafer. For the FEM gate unit of the invention, the cells are arranged in a perpendicular grid to form a memory array, as shown in FIG. 5.

Using a bulk CMOS substrate as an example to explain the fabrication process, the initial step is to fabricate $n^-$ well and $p^-$ well structures, isolate these structures, and implant appropriate ions to provide threshold voltage adjustment for the transistors. Substrate 80, in this embodiment, has been made into $p^-$ silicon, or a $p^-$ well. Photoresist is used to mask sections of the wafer. Next, phosphorous ions, also referred to herein as doping impurities of a second type, are implanted at an energy of between 30 keV to 120 keV, with a dose of $1.0 \times 10^{12}$ cm$^{-2}$ to $5.0 \times 10^{13}$ cm$^{-2}$ to the $p^-$ well where the FEM gate units are to be constructed, thereby forming a conductive channel of a second type, i.e., $n^-$. Multiple implantation steps, and/or thermal diffusion may be required to obtain an optimum donor distribution in the $n^-$ layer. The photoresist is stripped away. The implanted $n^-$ type silicon layer (32) may also be replaced with a selective epitaxial growth of silicon with a thickness of 100 nm to 1000 nm.

A $p^-$ layer 112 is next formed on active region 32. This $p^-$ layer may be formed by implanting B or $BF_2$ ions, referred to herein as doping impurities of a sixth type, on active layer 32. Boron ions may be implanted at an energy of 3 keV to 80 keV, while $BF_2$ ions are implanted with an energy level of between 15 keV and 50 keV. Ion concentration in both instances is in the range of $5 \cdot 10^{11}$ cm$^{-2}$ to $1 \cdot 10^{13}$ cm$^{-2}$. The ions are thermally activated by annealing. The implanted ions will diffuse into the $n^-$ active region, to form a $p^-$ layer, referred to herein as a conductive channel of a sixth type. Annealing takes place at a temperature in a range of between 500° C. and 1100° C.

At this point, formation of the FEM gate unit may begin. A FEM gate unit is identified generally at 48 and includes a lower electrode 50, c-axis oriented ferroelectric (FE) material 52, and a upper electrode 54. The construction of FEM gate unit 48 begins with the deposition of the lower electrode on $p^-$ layer 112. Lower electrode 50 may be formed as previously described. Other appropriate conductive barrier layer material may also be used. The thickness of electrode 50 is 20 nm to 100 nm, in the preferred embodiment.

Next, the FE material is deposited by chemical vapor deposition (CVD). The FE material is c-axis oriented $Pb_5Ge_3O_{11}$. FE material 52 is deposited to a thickness of 100 nm to 400 nm.

Upper electrode 54 is then formed over the FE material. The upper electrode may be formed of the same materials as the lower electrode, to a thickness of 20 nm to 200 nm.

Photoresist is applied over the FEM gate unit, and the cell is then etched to the proper configuration and size. It should be appreciated that the three layers of the FEM gate unit need not be precisely aligned as shown, as their shape may be formed by applying a photoresist, and etching, with masks that have different geometries. However, for the sake of clarity, the FEM gate unit is depicted as a structure which has contiguous, aligned sidewalls.

A layer of $TiO_x$, 62, or other suitable barrier insulation material is formed by CVD to protect the FEM gate unit. The $TiO_x$ is etched to form the sidewall insulator for the gate electrode.

Active region 32 is modified to form a source region 42, a gate region 44, and a drain region 46. These regions are formed by applying a photoresist across active region 32, $p^-$ layer 112 and FEM gate unit 48 to mask what will ultimately be gate region 44, and implanting the appropriate ions, also referred to herein as doping impurities of a first type, in the remainder of active region 32 to form two $n^-$ layers, also referred to herein as conductive channels of a first type, which will serve as source region 42 and drain region 46. It should be noted that $p^-$ layer 112 extends over gate junction region 44 and partially over drain junction region 46. Appropriate ion implantation in this instance may be the implantation of As ions at a preferred energy of about 50 keV, although implantation in a range of 40 keV to 70 keV is acceptable, and a dosing in a range of $1 \cdot 10^{15}$ cm$^{-2}$ to $5 \cdot 10^{15}$ cm$^{-2}$. Alternately, phosphorus ions may be implanted in an energy range of 30keV–60 keV in the same dosing range.

The wafer is heat treated to activate and defuse the implanted ions, both in the source region and drain region, and in the lower electrode. Diffusion of the B or $BF_2$ ions, doping impurities of the sixth type, implanted in layer 112 results in the formation of a shallow $p^-$ junction under FEM gate unit 48 which is a conductive channel of a sixth type. Temperature range for the heat treatment is in the range of 500° C. to 1100° C., to allow passivation and diffusion of the implanted ions. A sidewall 62 of $TiO_x$ is formed about FEM gate unit 48. A layer 64 of $SiO_2$ is then formed over the structure by CVD, or, other suitable passivation insulation is applied.

FEM gate unit 48 is depicted as part of a FEM memory cell 110, which includes FEM gate unit 48 and the underlying source, channel and drain regions, which embodiment includes a thin shallow junction region 112, which is a p⁻ layer, formed under FEM gate unit 48.

To complete the description of FEM cell 110, bores are formed in oxide layer 64 to receive a source electrode 66, a gate electrode 68 and a drain electrode 70, which are connected to their respective components. Drain electrode 70 may be seen to connect to both drain region 46 and p⁻ junction 112.

The embodiment depicted in FIG. 11 represents a c-axis oriented ferroelectric gate depletion-type MIS transistor. At zero gate voltage, the charge in the n⁻ channel underlying the FEM gate unit is completely depleted. Accordingly, the leakage current is very small. In order to maintain the small leakage, the distance between any edge of lower electrode 50 and the edges of the n⁺ source or n⁺ drain regions, represented by "D", has to be at least 50 nm in order that the leakage current remain small. However, as D increases, the series resistance of the memory cell also increases. It is therefore preferred that D be no larger than 300 nm. The gate leakage current is determined by the platinum to p⁻ type silicon shallow junction 112 and the platinum to c-axis oriented ferroelectric material contact. The leakage current is the gate current at a very small up to moderate field intensity. The potential barrier between the p⁻ layer and n⁻ type silicon is 0.8 eV to 1.0 eV. A potential barrier of this magnitude causes the n⁻ type silicon channel to be completely depleted when the c-axis oriented ferroelectric material is not polarized, or when the c-axis oriented ferroelectric material is polarized with negative charge at the lower electrode. When the c-axis oriented ferroelectric material is polarized with a positive charge at the lower electrode, the threshold voltage of the memory transistor is small. The nature of these memory charges and techniques for changing the amount of voltage necessary to the program the cells will be described later herein.

Alternately, the source/drain ion implantation and annealing may be completed before the deposition of the lower gate electrode, if the c-axis oriented ferroelectric material is unable to sustain high temperature heat treatment.

The structure constructed according to the invention is particularly efficient because the FEM gate unit, located over the conductive channel on the gate region, is able to shift the polarity of the gate region, allowing efficient current flow from the source through the channel to the drain. The structure provides for total charge depletion when in an "off" condition. When in an "on" condition, current flows through the entire channel region.

Memory cells constructed according to the invention may be placed in an array of memory cells such that the gate lines run perpendicular to the drain lines, as shown in FIG. 5. In order to write to FEM gate unit 48, $+V_{P1}$ is applied to all gate electrodes, while the source and drain electrodes of the memory cell are at the ground potential. This polarizes FE 52 such that a positive charge is located at lower electrode 50 and a negative charge is located at upper electrode 54. (See FIG. 6a). This places FEM gate unit 48 in a high conductive state.

When a negative voltage, $-V_{P0}$, is applied to the gate electrode (program line), and a positive voltage, $+V_{P0}$ is applied to the drain, and the source is grounded, and where $|V_{P1}|>|V_{P0}|$, the FE is polarized with a negative charge at lower electrode 50. This places FEM gate unit 48 in a low conductive state. (see FIG. 6b). The write process enables each memory transistor in a memory array to be written to independent of other memory cells in the array, with no interference to or from the programming of the other memory cells in the array.

The threshold voltage for FEM gate unit 48 may be determined as follows: for a large scale array the threshold voltage at the "1" state has to be a positive value, i.e., 0.4V to 0.8V. The threshold voltage for the "0" state has to be larger than the supply voltage, i.e., 3.3 V. The n⁻ channel layer is depleted by the p⁻ type substrate junction as well as by the very shallow p⁻ surface layer and the gate bias voltage. Equation (1) defines the memory window.

The width of the space in the n⁻ region of a p⁺/n junction is about 0.3 $\mu$m if the doping density of the n⁻ region is $1.0 \times 10^{16}$ cm⁻³. It is apparent that if the thickness and doping of the n⁻ channel layer are small, the "1" state threshold voltage can be a positive value. The threshold voltage can be adjusted by the doping density and the thickness of both n⁻ channel layer and p⁻ surface layer, the permitivity and the remnant charge of the c-axis oriented ferroelectric capacitor.

During a read operation, a voltage, $V_a$, of no larger than the coercive voltage, i.e., that voltage where the memory content may change, is applied to the gate electrode and the drain electrode. Because the content of the memory cell is not disturbed when any electrode is biased with $V_a$, the read operation will not disturb the memory contents of any memory cell. Therefore, a long charge retention is obtained.

Figure 12:
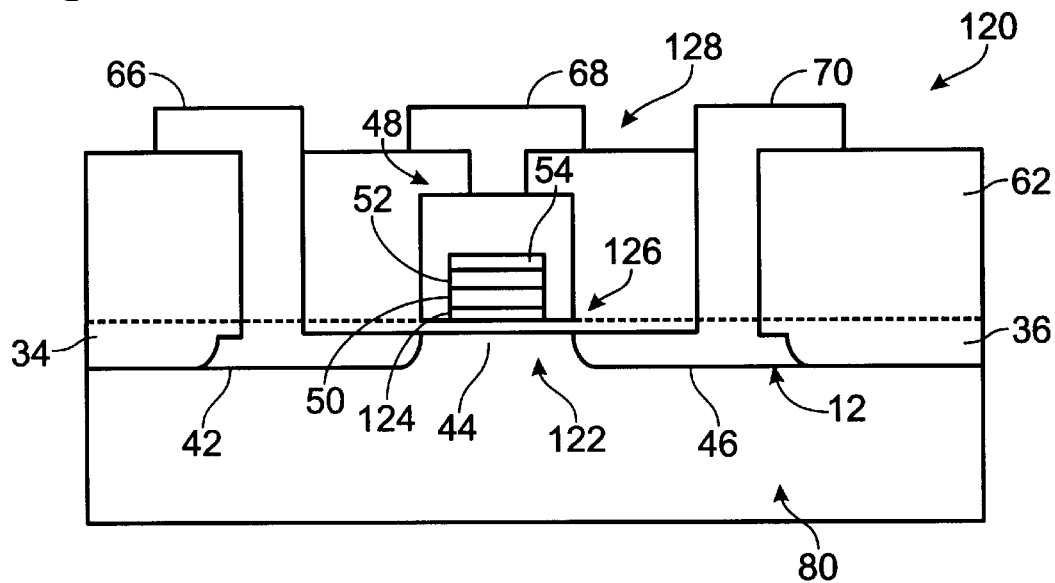
FIG. 12 depicts a FEM cell suitable for use in a VLSI RAM Array.

Referring now to FIG. 12, a FEM cell intended for use in a VLSI RAM array is depicted generally at 120. As previously described, the invention includes a method of making a MFMOS memory cell which includes a c-axis oriented ferroelectric (FE) capacitor, or FEM gate unit, located on top of a MOS capacitor, the two devices being collectively referred to herein as a stacked gate unit. In one embodiment of the invention, the area of the MOS capacitor is greater than that of the c-axis oriented ferroelectric capacitor, which increases the coupling efficiency of the device.

Another embodiment is described wherein a second transistor is formed alongside the stacked MOS and FE capacitors, and includes placing a c-axis oriented ferroelectric capacitor on top of a MOS capacitor wherein the c-axis oriented ferroelectric capacitor and the MOS capacitor have the same cross-section. This configuration, depicted in FIG. 12, results in a very small cell size and a lower programming voltage than that of the differentially sized structure, also referred to as an off-set gate c-axis oriented ferroelectric memory cell.

A third embodiment includes a MOS capacitor stacked with a FE capacitor, wherein both capacitors have the same size footprint. The juxtaposition of MOS transistor and FE capacitor are referred to herein as placing the two structures adjacent one another, and includes the configuration where the two structures are vertically stacked, or located horizontally relative one another.

The stacked c-axis oriented ferroelectric memory gate unit of the invention may be formed on a SOI (SIMOX) substrate, or, it may be formed in a bulk silicon substrate which has a p⁻ well formed therein. When a bulk substrate is used, the substrate is either a n⁻ type or a p⁻ type. The initial step is to fabricate n⁻ well and p⁻ well structures, isolate these structures, and implant appropriate ions to provide threshold voltage adjustment for the transistors. When a SOI substrate is used, it is not necessary to form either the n⁻ well or the p⁻ well.

As shown in FIG. 12, a silicon substrate is depicted at 80. Substrate 80, in the preferred embodiment is a single-crystal substrate, and is formed of bulk silicon. As depicted in FIG. 12, substrate 80 is formed of n⁻ silicon. A p⁻ well 122, a conductive channel of a fourth type, may be formed by implanting B or $BF_2$ ions into the surface of the substrate, followed by a thermal diffusion step at temperatures ranging between 950° C. to 1200° C. for one to four hours. Boron ions may be implanted at an energy of 3 keV to 80 keV, while $BF_2$ ions are implanted with an energy level of between 15 keV and 50 keV. Ion dose in both instances are in the range of $1 \cdot 10 \, cm^{-2}$ to $1 \cdot 10^- \, cm^{-2}$.

A layer of oxide 124 is formed over p⁻ well 122, and is bounded by insulating regions 34, 36, formed of $SiO_2$. As is well known to those of a skill in the art, a multiplicity of such regions are formed on the surface of a silicon wafer. For the structure of the invention, the cells are arranged in a perpendicular grid of gate to drain and p⁻ well to form a memory array. Additional layers are deposited thereover in sequence, and include an optional n⁺ polysilicon layer 126, a lower electrode 50, a FE layer 52, and an upper electrode 54, the latter elements forming FEM gate unit 48.

Photoresist is applied and the structure is etched, allowing for the construction of a MOS capacitor 128, and a FEM gate unit, or capacitor, 48, formed into a stacked gate unit 130. At this point, a layer of insulating material, such as $TiO_x$ 62, or other suitable insulating material may be applied in order to protect the c-axis oriented ferroelectric. Photoresist is then applied to protect the p⁻ channel structure and n⁺ ion are implanted to form a n⁺ source region 42 and n⁺ drain region 46. The remaining p⁻ material provides a gate channel 44.

The final structure includes an insulating layer 62, a source electrode 66, a gate electrode 68, and a drain electrode 70.

This particular embodiment provides for a very small cell size. The device is exceptionally suitable for use in VLSI memory applications.

Figure 13:
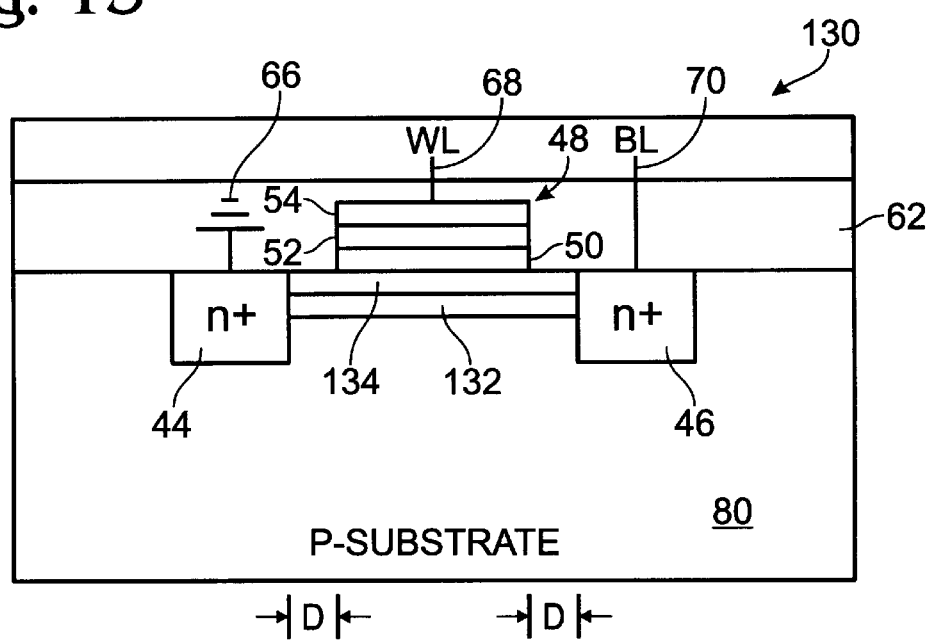
FIG. 13 depicts a single transistor FEM cell having asymmetrical FE polarization.

Turning now to FIG. 13, a single transistor FEM cell having asymmetrical FE polarization is depicted generally at 140. A silicon substrate is depicted at 80. Substrate 80, in the preferred embodiment is a single-crystal substrate, and is formed of bulk silicon. Other embodiments may be formed on a SOI substrate. As depicted in FIG. 13, the p⁻ well 80 has doping impurities of a fourth type, which is a boron or boron compound, of a concentration of about $1.0 \cdot 10^{15} \, cm^{-3}$ to $5.0 \cdot 10^{16} \, cm^{-3}$.

A shallow n⁻ type layer 142, also referred to herein as conductive channel of a second type, which has doping impurities of a second type, is then formed under the gate area by phosphorous or arsenic implantation. The ion energy is in the range of 10 keV to 50 keV and the dose is in the range of $1.0 \cdot 10^{12} \, cm^{-2}$ to $1.0 \cdot 10^{13} \, cm^{-2}$.

A very shallow layer of p⁻ type silicon 144 is formed, and has doping impurities of a sixth type, implanted with $BF_2$ to the top of the n⁻ type second conducting layer. The $BF_2$ energy is in the range of 10 keV to 40 keV, and the dose range is between about $5.0 \cdot 10^{11} \, cm^{-2}$ to $5.0 \cdot 10^{12} \, cm^{-2}$. This layer is referred to herein as a conductive channel of a sixth type.

At this point, formation of the FEM gate unit may begin. A FEM gate unit is identified generally at 48 and includes a lower electrode 50, c-axis oriented ferroelectric (FE) material 52, and an upper electrode 54. The construction of FEM gate unit 48 begins with the deposition of the lower electrode 50 on p⁻ layer 144. Lower electrode 50 may be formed as previously described. The thickness of this metal is 20 nm to 100 nm, in the preferred embodiment. The c-axis oriented FE material 50 is deposited to a thickness of 50 nm to 400 nm. Upper electrode 54 is then formed over the FE material. The upper electrode may be formed as previously described to a thickness of 20 nm to 200 nm.

Photoresist is applied over the FEM gate unit, and the cell is then etched to the proper configuration and size. It should be appreciated that the three layers of the FEM gate unit need not be precisely aligned as shown, as their shape may be formed by applying a photoresist, and etching, with masks that have different geometries. However, for the sake of clarity, the FEM gate unit is depicted as a structure which has contiguous, aligned sidewalls.

The p⁻ substrate 80 is now modified by implanting the appropriate ions, also referred to herein as doping impurities of a first type to form two n⁺ layers, also referred to herein as conductive channels of a first type, which will serve as source region 42 and a drain region 46. Appropriate ion implantation in this instance may be the implantation of As ions at a preferred energy of about 50 keV, although implantation in a range of 40 keV to 70 keV is acceptable, and a dosing in a range of $1 \cdot 10^{15} \, cm^{-2}$ to $5 \cdot 10^{15} \, cm^{-2}$. Alternately, phosphorus ions may be implanted in an energy range of 30 keV–60 keV in the same dosing range.

The wafer is heat treated to activate and diffuse the implanted ions, both in the source region and drain region. Temperature range for the heat treatment is in the range of 500° C. to 1100° C., to allow activation and diffusion of the implanted ions.

A layer of $TiO_x$, $Si_3N_4$, or other suitable barrier insulation material 62, is formed by CVD to protect the FEM gate unit, which results in the formation of a FE memory cell 140.

To complete the description of FEM cell 140, bores are formed in insulating layer 62 to receive a word line (WL) (gate) electrode 68, and a bit line (BL) electrode 70, which are connected to their respective components. Source 44 is connected to ground 66.

The embodiment depicted in FIG. 13 represents a c-axis oriented ferroelectric gate depletion-type MFMS transistor. At zero gate voltage, the charge in the n⁻ channel underlying the FEM gate unit is completely depleted. Accordingly, the leakage current is very small. In order to maintain the small leakage, the distance between any edge of lower electrode 50 and the edges of n⁺ source region 42 and n⁺ drain region 46, represented by "D", has to be at least 50 nm in order that the leakage current remain small. However, as D increases, the series resistance of the memory cell also increases. It is therefore preferred that D be no larger than 300 nm. The potential barrier between the p⁻ conductive layer of the sixth type 144 and the n⁻ conductive layer of the second type 142 is on the order of 0.9 eV. A potential barrier of this magnitude causes the n⁻ type silicon channel to be completely depleted when the c-axis oriented ferroelectric material is not polarized. When the c-axis oriented ferroelectric material 52 is polarized with positive charge adjacent to lower electrode 50, the threshold voltage is small. When the c-axis oriented ferroelectric material 52 is polarized with a negative charge adjacent to the lower electrode 50, the threshold voltage of the memory transistor is very large. The nature of these memory charges and techniques for changing the amount of voltage necessary to the program the cells will be described later herein.

Alternately, the source/drain ion implantation and annealing may be completed before the deposition of the lower gate electrode, if the c-axis oriented ferroelectric material is unable to sustain high temperature heat treatment.

The structure constructed according to the invention is particularly efficient because the FEM gate unit, located over the conductive channel on the gate region, is able to shift the polarity of the gate region, allowing efficient current flow from the source through the channel to the drain. The structure provides a total charge depletion when in an "off"

condition. The operating theory of a depletion-type device is similar to that of a junction FET.

This c-axis oriented ferroelectric memory device may be used in low voltage, high density and high speed applications. The memory cells are laid out as depicted in FIG. 5. The memory array is block programmed to the "I" (high conductive) state by applying a positive voltage of $V_{PP}$ to the word line (gate) with the bit line connected to ground. In order to program each individual memory cell to a "0" (low conductive) state, a negative programming voltage, $-V_{pp}$, is applied to the word line while a positive programming voltage of $V_{pp}$ is applied to the bit line. This results in only one cell having a bias voltage of $-V_{pp}$ at the gate and $+V_{pp}$ at the drain. This memory cell is the only cell in the entire array which will be written to the "0" state.

The asymmetric polarization relaxation may be observed in many combinations of electrodes. Additionally, it may be observed on any c-axis oriented ferroelectric thin films and any kind of c-axis oriented ferroelectric gate structures. The mechanism of the asymmetric polarization relaxation is both complex and sensitive to processed condition. This requires that, in the preferred embodiment of the invention, the asymmetric polarization relaxation technique should be used to fabricate the c-axis oriented ferroelectric gate controlled one transistor memory cell.

The threshold voltage for FEM gate unit 48 may be determined as follows: for a large scale array the threshold voltage at the "1" state has to be a small positive value, i.e., 0.4V to 0.8V. The threshold voltage for the "0" state has to be larger than the supply voltage, i.e., 3.3 V. The n⁻ channel layer is depleted by the p⁻ type substrate junction as well as by the very shallow p⁻ surface layer and the gate bias voltage. The memory window is defined by Equation (1).

During a read operation, a voltage, $V_a$, of no larger than the coercive voltage, i.e., that voltage where the memory content may change, is applied to the gate electrode and the drain electrode. Because the content of the memory cell is not disturbed when any electrode is biased with $V_a$, the read operation will not disturb the memory contents of any memory cell. Therefore, a long charge retention is obtained.

Thus, a FEM memory cell, and a method of constructing same, and a number of variations of each, has been disclosed. The FEM gate unit may be constructed as a single transistor device, or it may be constructed with an associated MOS transistor. Although several embodiments of the invention have been disclosed, it should be appreciated that further variations may be made to the architecture and method without departing from the scope of the invention as defined in the appended claims.

We claim:

1. A ferroelectric memory (FEM) cell comprising:
   a single-crystal silicon substrate including an active region therein;
   a source junction region and a drain junction region located in said active region, doped with doping impurities of a first type to form a pair of conductive channels of a first type;
   a gate junction region located in said active region between said source junction region and said drain junction region, doped to form a conductive channel of a second type;
   a FEM gate unit including a lower electrode, a c-axis oriented $Pb_5Ge_3O_{11}$ FE layer and an upper electrode; wherein said FEM gate unit is sized on the gate junction region such that any edge of said FEM gate unit is a distance "D" from the edges of said source junction region and said drain junction region, where "D" is between about 50 nm and 300 nm.
   an insulating layer, having an upper surface, overlying said junction regions, said FEM gate unit and said substrate;
   a source electrode and a drain electrode, each located on the upper surface of said insulating layer and extending therethrough to make electrical contact with their respective junction regions, and a gate electrode located on the upper surface of said insulating layer and extending therethrough to make electrical contact with the upper electrode of said FEM gate unit.

2. The FEM cell of claim 1 which includes a conductive channel precursor region located on said gate junction region; wherein said conductive channel precursor includes Pt ions therein which diffuse from the lower electrode of said FEM gate unit during annealing of the structure at a temperature of about 500° C. to 1100° C.

3. The FEM cell of claim 1 which includes a conductive channel precursor region located on said gate junction region; wherein said conductive channel precursor includes ions implanted therein, and wherein the ions are taken from the group consisting of B and $BF_2$, implanted at an energy in a range of 3 keV to 10 keV and 15 keV to 50 keV, respectively, and a dose of $5·10^{11}$ cm$^{-2}$ to $1·10^{13}$ cm$^{-2}$.

4. The FEM cell of claim 1 wherein said lower electrode has a thickness of about 20 nm to 100 nm, said FE layer has a thickness of about 100 nm to 400 nm, and said upper electrode has a thickness of 20 nm to 100 nm, wherein said lower electrode and said upper electrode are formed of material taken from the group consisting of Pt, Ir, $IrO_2$ and Pt/Ir alloy.

5. The FEM cell of claim 1 wherein said doping impurities of said second type include ions taken from the group consisting of As, implanted at an energy of about 40 keV to 70 keV, and phosphorous, implanted at an energy of about 30 keV to 60 keV, the ions having a dose of about $2·10^{15}$ cm$^{-2}$ to $5·10^{15}$ cm$^{-2}$.

6. The FEM cell of claim 1 which includes a conductive channel region of a fourth type located in said active region, doped with a doping impurity of a fourth type; a MOS transistor located adjacent said conductive channel of said second type; wherein said drain electrode makes contact with said drain junction region and said conductive channel of said fourth type; and wherein said conductive channel of said fourth type includes ions implanted therein, and wherein the ions are taken from the group consisting of B and $BF_2$, implanted at an energy in a range of 3 keV to 10 keV and 15 keV to 50 keV, respectively, and a dose of $5·10^{11}$ cm$^{-2}$ to $1·10^{13}$ cm$^{-2}$, which diffuse from the device area during annealing of the structure at a temperature of about 500 C to 1100 C.

7. The FEM cell of claim 6 wherein said FEM gate unit overlays said MOS transistor.

8. The FEM cell of claim 6 wherein said MOS transistor and said FEM gate unit are arranged side-by-side.

9. The FEM cell of claim 1 which includes a conductive channel of a fourth type located on said gate junction region, wherein said FEM gate unit overlays said conductive channel of said fourth type and has a surface area less than that of said conductive channel region of said fourth type; wherein said conductive channel of said fourth type includes ions implanted therein, and wherein the ions are taken from the group consisting of B and $BF_2$, implanted at an energy in a range of 3 keV to 10 keV and 15 keV to 50 keV, respectively, and a dose of $5·10^{11}$ cm$^{-2}$ to $1·10^{13}$ cm$^{-2}$, which diffuse from the lower electrode of said FEM gate unit during annealing of the structure at a temperature of about 500° C. to 1100° C.

10. The FEM cell of claim 9 wherein said conductive channel of said fourth type is constructed and arranged such that any edge thereof is a distance "C" from the edges of the source junction region and the drain junction regions, wherein "C" is between about 0 nm and 300 nm.

11. The FEM cell of claim 1 which includes a conductive channel of a fourth type located on said gate junction region and extending partially into said drain junction region; wherein said FEM gate unit overlays said conductive channel of said fourth type and has a surface area less than that of said conductive channel region of said fourth type, and is sized on the gate junction region such that any edge of said FEM gate unit is a distance "D" from the edges of said source junction region and said drain junction region, where "D" is between about 50 nm and 300 nm; wherein said conductive channel of said fourth type includes ions implanted therein, and wherein the ions are taken from the group consisting of B and $BF_2$, implanted at an energy in a range of 3 keV to 10 keV and 15 keV to 50 keV, respectively, and a dose of $5 \cdot 10^{11}$ cm$^{-2}$ to $1 \cdot 10^{13}$ cm$^{-2}$, which diffuse from the device area during annealing of the structure at a temperature of about 500° C. to 1100 ° C.

12. The FEM cell of claim 1 which further includes a silicide layer overlaying said source junction region and said drain junction region.

13. The FEM cell of claim 1 including a MOS capacitor, including an oxide layer and a conductive layer of $n^+$ polysilicon located over said gate junction region, said MOS capacitor having a predetermined surface area; wherein said FEM gate unit is stacked on and overlays at least a portion of said MOS capacitor, thereby forming, with said MOS capacitor, a stacked gate unit.

14. The FEM cell of claim 13 wherein said FEM capacitor overlays the entire surface area of said MOS capacitor.

15. The FEM cell of claim 13 wherein said FEM capacitor overlays less than the entire surface area of said MOS capacitor.

16. The FEM cell of claim 13 which further includes a second MOS capacitor formed alongside of said stacked gate unit.

17. The FEM cell of claim 1 including a silicon substrate of a second conductive type; a shallow conductive channel of a fourth conductive type formed in said substrate; wherein said conductive layer of said second conductive type is formed in said shallow conductive channel of said fourth type, providing a gate junction region.

* * * * *